United States Patent
Lin et al.

(10) Patent No.: US 11,430,538 B1
(45) Date of Patent: Aug. 30, 2022

(54) MEMORY CONTROL METHOD, MEMORY STORAGE DEVICE, AND MEMORY CONTROL CIRCUIT UNIT

(71) Applicant: PHISON ELECTRONICS CORP., Miaoli (TW)

(72) Inventors: Yu-Hsiang Lin, Yunlin County (TW); Pochiao Chou, Hsinchu (TW); Cheng-Che Yang, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 47 days.

(21) Appl. No.: 17/195,547

(22) Filed: Mar. 8, 2021

(30) Foreign Application Priority Data

Feb. 9, 2021 (TW) .................................. 110105062

(51) Int. Cl.
   *G11C 29/42* (2006.01)
   *G11C 29/18* (2006.01)
   *G11C 29/44* (2006.01)

(52) U.S. Cl.
   CPC .............. *G11C 29/42* (2013.01); *G11C 29/18* (2013.01); *G11C 29/44* (2013.01); *G11C 2029/1802* (2013.01)

(58) Field of Classification Search
   CPC .......... G11C 29/42; G11C 29/44; G11C 29/18
   See application file for complete search history.

(56) References Cited

U.S. PATENT DOCUMENTS

| 10,658,040 | B2* | 5/2020 | Lim | G11C 16/08 |
| 2015/0378887 | A1* | 12/2015 | Lee | G11C 16/10 |
| | | | | 711/103 |
| 2019/0096491 | A1* | 3/2019 | Jung | G11C 16/32 |

FOREIGN PATENT DOCUMENTS

TW          201608572          3/2016

OTHER PUBLICATIONS

"Office Action of Taiwan Counterpart Application", dated Nov. 25, 2021, p. 1-p. 10.

* cited by examiner

*Primary Examiner* — Tuan T Nguyen
(74) *Attorney, Agent, or Firm* — JCIPRNET

(57) ABSTRACT

A memory control method, a memory storage device, and a memory control circuit unit are provided. The method includes: executing a single page encoding operation on first data stored in a first type physical unit to generate local parity data; executing a global encoding operation on second data stored in at least two of the first type physical unit, a second type physical unit, and a third type physical unit to generate global parity data; reading the second data from the at least two of the first type physical unit, the second type physical unit, and the third type physical unit in response to a failure of a single page decoding operation for the first data; and executing a global decoding operation on the second data according to the global parity data.

21 Claims, 9 Drawing Sheets

MEMORY CONTROL METHOD, MEMORY STORAGE DEVICE, AND MEMORY CONTROL CIRCUIT UNIT

CROSS-REFERENCE TO RELATED APPLICATION

This application claims the priority benefit of Taiwan application serial no. 110105062, filed on Feb. 9, 2021. The entirety of the above-mentioned patent application is hereby incorporated by reference herein and made a part of this specification.

BACKGROUND

Technical Field

The disclosure relates to a memory control technology, and particularly relates to a memory control method, a memory storage device, and a memory control circuit unit.

Description of Related Art

Digital cameras, mobile phones, and MP3 players have grown rapidly over the past few years, which has led to a rapid increase in consumer demand for storage media. Since the rewritable non-volatile memory module (for example, the flash memory) has the characteristics such as non-volatile data, power saving, small size, and no mechanical structure, the rewritable non-volatile memory module is very suitable to be built into the various portable multimedia devices mentioned above.

In order to ensure the correctness of data, the data will be encoded first and then stored in the rewritable non-volatile memory module. When reading the data, the data will be decoded to try to correct errors therein. If all errors in the data are corrected, the corrected data will be sent back to a host system. However, as the size of the rewritable non-volatile memory module becomes smaller and smaller, the errors in the read data are becoming more and more difficult to correct.

SUMMARY

The disclosure provides a memory control method, a memory storage device, and a memory control circuit unit, which can improve the ability to correct errors in data.

An exemplary embodiment of the disclosure provides a memory control method for a rewritable non-volatile memory module. The rewritable non-volatile memory module includes multiple physical units. The physical units include a first type physical unit, a second type physical unit, and a third type physical unit. The memory control method includes the following steps. An encoding circuit executes a single page encoding operation on first data stored in the first type physical unit to generate local parity data. The encoding circuit executes a global encoding operation on second data stored in at least two of the first type physical unit, the second type physical unit, and the third type physical unit to generate global parity data. The second data includes the first data. A decoding circuit executes a single page decoding operation on the first data according to the local parity data. The second data is read from the at least two of the first type physical unit, the second type physical unit, and the third type physical unit in response to a failure of the single page decoding operation. The decoding circuit executes a global decoding operation on the second data according to the global parity data to correct an error in the first data.

The exemplary embodiment of the disclosure further provides a memory storage device, which includes a connection interface unit, a rewritable non-volatile memory module, and a memory control circuit unit. The connection interface unit is configured to be coupled to a host system. The rewritable non-volatile memory module includes multiple physical units. The physical units include a first type physical unit, a second type physical unit, and a third type physical unit. The memory control circuit unit is coupled to the connection interface unit and the rewritable non-volatile memory module. The memory control circuit unit is configured to execute a single page encoding operation on first data stored in the first type physical unit to generate local parity data. The memory control circuit unit is further configured to execute a global encoding operation on second data stored in at least two of the first type physical unit, the second type physical unit, and the third type physical unit to generate global parity data. The second data includes the first data. The memory control circuit unit is further configured to execute a single page decoding operation on the first data according to the local parity data. The memory control circuit unit is further configured to read the second data from the at least two of the first type physical unit, the second type physical unit, and the third type physical unit in response to a failure of the single page decoding operation. The memory control circuit unit is further configured to execute a global decoding operation on the second data according to the global parity data to correct an error in the first data.

An exemplary embodiment of the disclosure further provides a memory control circuit unit, which is configured to control a rewritable non-volatile memory module. The rewritable non-volatile memory module includes multiple physical units. The physical units include a first type physical unit, a second type physical unit, and a third type physical unit. The memory control circuit unit includes a host interface, a memory interface, an error detecting and correcting circuit, and a memory management circuit. The host interface is configured to be coupled to a host system. The memory interface is configured to be coupled to the rewritable non-volatile memory module. The memory management circuit is coupled to the host interface, the memory interface, and the error detecting and correcting circuit. The error detecting and correcting circuit is configured to execute a single page encoding operation on first data stored in the first type physical unit to generate local parity data. The error detecting and correcting circuit is further configured to execute a global encoding operation on second data stored in at least two of the first type physical unit, the second type physical unit, and the third type physical unit to generate global parity data. The second data includes the first data. The error detecting and correcting circuit is further configured to execute a single page decoding operation on the first data according to the local parity data. The memory management circuit is configured to read the second data from the at least two of the first type physical unit, the second type physical unit, and the third type physical unit in response to a failure of the single page decoding operation. The error detecting and correcting circuit is further configured to execute a global decoding operation on the second data according to the global parity data to correct an error in the first data.

Based on the above, the physical units in the rewritable non-volatile memory module may include the first type physical unit, the second type physical unit, and the third type physical unit. When encoding data, the encoding circuit may execute the single page encoding operation on the first data stored in the first type physical unit to generate the local parity data. In addition, the encoding circuit may also execute the global encoding operation on the second data stored in the at least two of the first type physical unit, the second type physical unit, and the third type physical unit to generate the global parity data. The second data includes the first data. When decoding data, the decoding circuit may execute the single page decoding operation on the first data according to the local parity data. The second data may be read from the at least two of the first type physical unit, the second type physical unit, and the third type physical unit in response to the failure of the single page decoding operation. Then, the decoding circuit may execute the global decoding operation on the second data according to the global parity data to correct the error in the first data. In this way, the ability to correct errors in the data stored in the rewritable non-volatile memory module can be improved.

For the features and advantages of the disclosure to be more comprehensible, the following embodiments are described in detail in conjunction with the accompanying drawings.

DETAILED DESCRIPTION OF DISCLOSED EMBODIMENTS

A memory storage device (also referred to as a memory storage system) includes a rewritable non-volatile memory module and a controller (also referred to as a control circuit). The memory storage device is usually used together with the host system, so that the host system may write data to the memory storage device or read data from the memory storage device.

Figure 1:
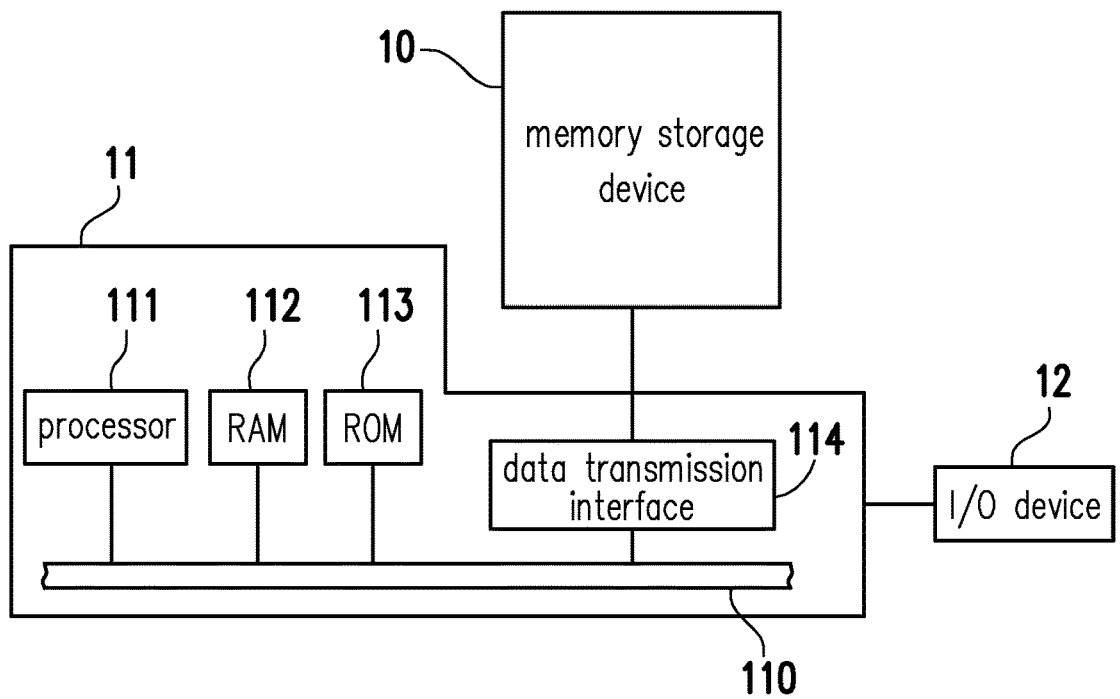
FIG. 1 is a schematic diagram of a host system, a memory storage device, and an input/output (I/O) device according to an exemplary embodiment of the disclosure.
Figure 2:
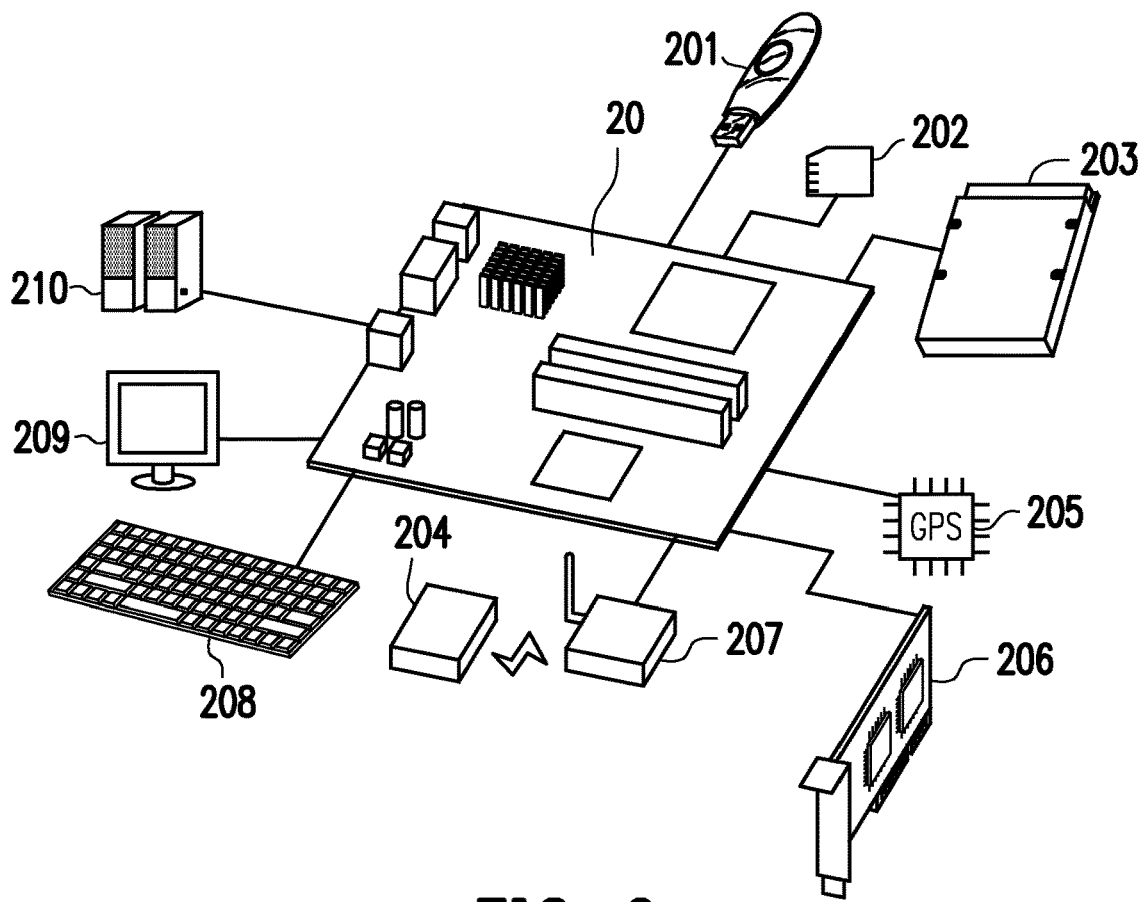
FIG. 2 is a schematic diagram of a host system, a memory storage device, and an I/O device according to another exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to another exemplary embodiment of the disclosure.

Please refer to FIG. 1 and FIG. 2. A host system 11 generally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In this exemplary embodiment, the host system 11 is coupled to the memory storage device 10 through the data transmission interface 114. For example, the host system 11 may store data to the memory storage device 10 or read data from the memory storage device 10 via the data transmission interface 114. In addition, the host system 11 is coupled to the I/O device 12 through the system bus 110. For example, the host system 11 may send an output signal to the I/O device 12 or receive an input signal from the I/O device 12 via the system bus 110.

In this exemplary embodiment, the processor 111, the random access memory 112, the read only memory 113, and the data transmission interface 114 may be disposed on a motherboard 20 of the host system 11. The number of data transmission interface 114 may be one or more. Through the data transmission interface 114, the motherboard 20 may be coupled to the memory storage device 10 via a wired or wireless manner. The memory storage device 10 may, for example, be a flash drive 201, a memory card 202, a solid state drive (SSD) 203, or a wireless memory storage device 204. The wireless memory storage device 204 may, for example, be a near field communication (NFC) memory storage device, a wireless fax (WiFi) memory storage device, a Bluetooth memory storage device, or a low-power Bluetooth memory storage device (for example, iBeacon), and other memory storage devices based on various wireless communication technologies. In addition, the motherboard 20 may also be coupled to various I/O devices such as a global positioning system (GPS) module 205, a network interface card 206, a wireless transmission device 207, a keyboard 208, a screen 209, and a speaker 210 through the system bus 110. For example, in an exemplary embodiment, the motherboard 20 may access the wireless memory storage device 204 through the wireless transmission device 207.

Figure 3:
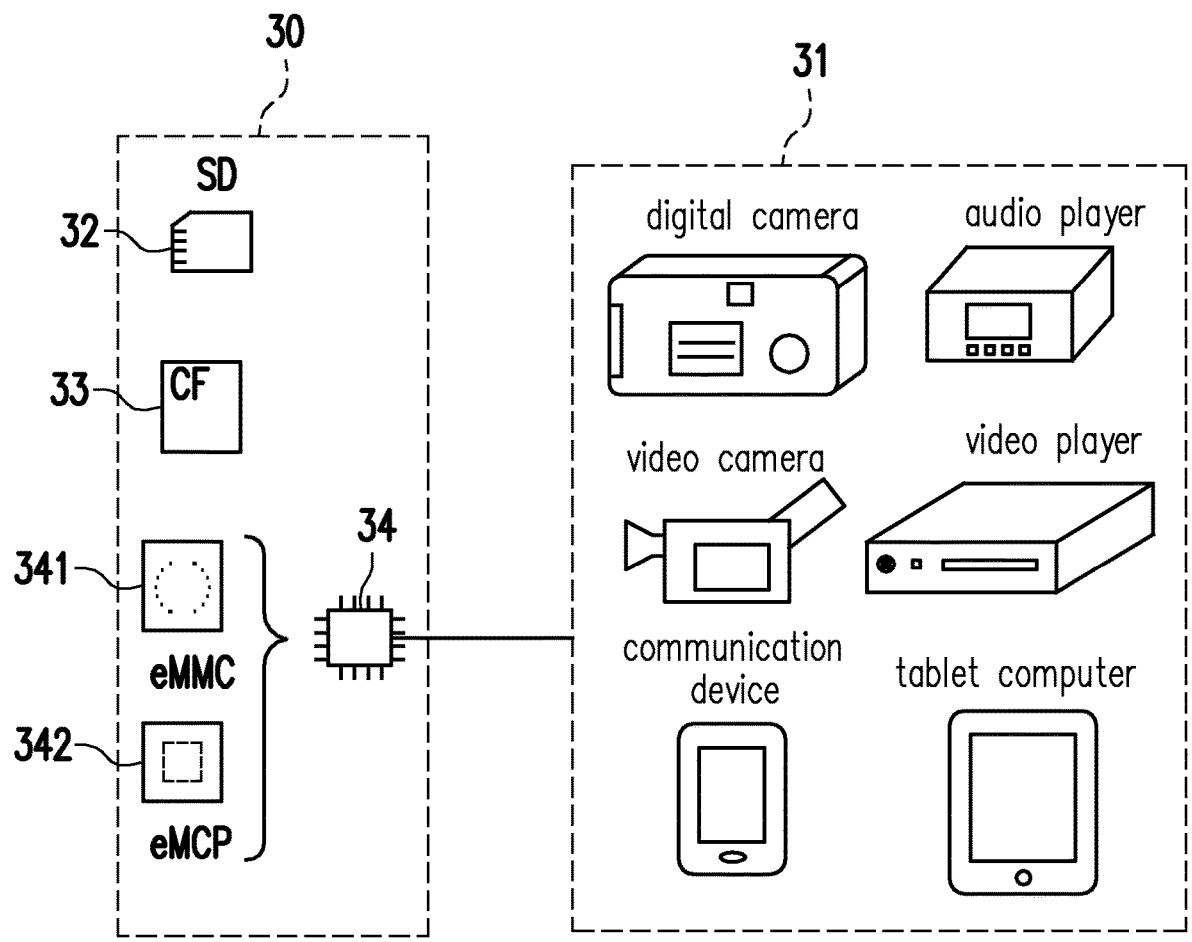
FIG. 3 is a schematic diagram of a host system and a memory storage device according to another exemplary embodiment of the disclosure.

In an exemplary embodiment, the host system is any system that may substantially cooperate with a memory storage device to store data. Although in the above exemplary embodiment, the host system is described as a computer system, FIG. 3 is a schematic diagram of a host system and a memory storage device according to another exemplary embodiment of the disclosure. Please refer to FIG. 3. In another exemplary embodiment, a host system 31 may also be a system such as a digital camera, a video camera, a communication device, an audio player, a video player, or a tablet computer, and a memory storage device 30 may be various non-volatile memory storage devices such as a secure digital (SD) card 32, a compact flash (CF) card 33, or an embedded storage device 34 used thereby. The embedded storage device 34 includes various embedded storage devices in which a memory module is directly coupled onto a substrate of a host system, such as an embedded multi media card (eMMC) 341 and/or an embedded multi chip package (eMCP) storage device 342.

Figure 4:
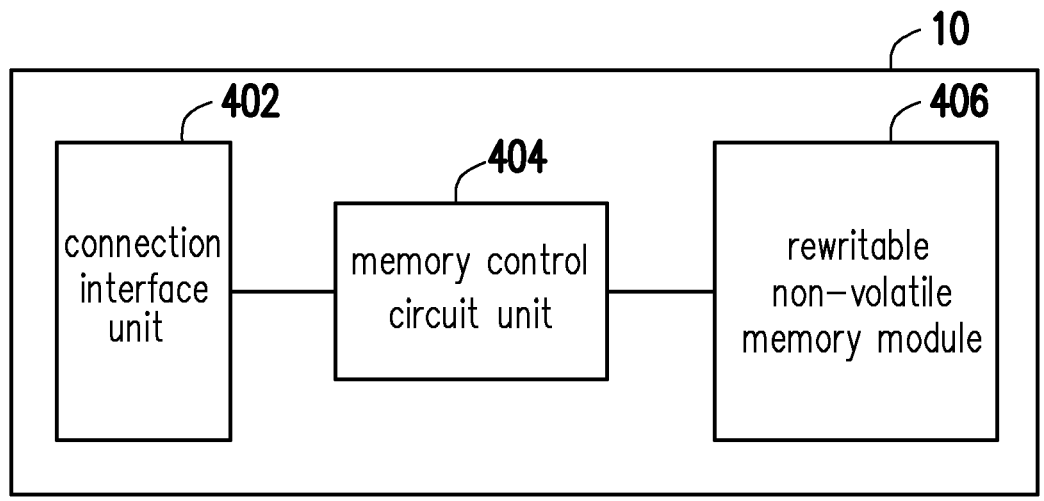
FIG. 4 is a schematic block diagram of a memory storage device according to an exemplary embodiment of the disclosure.

FIG. 4 is a schematic block diagram of a memory storage device according to an exemplary embodiment of the disclosure. Please refer to FIG. 4. A memory storage device 10 includes a connection interface unit 402, a memory control circuit unit 404, and a rewritable non-volatile memory module 406.

The connection interface unit 402 is configured to couple the memory storage device 10 to the host system 11. The memory storage device 10 may communicate with the host system 11 through the connection interface unit 402. In this exemplary embodiment, the connection interface unit 402 is compatible with the serial advanced technology attachment (SATA) standard. However, it must be understood that the disclosure is not limited thereto, and the connection interface unit 402 may also conform to the parallel advanced technology attachment (PATA) standard, the Institute of Electrical and Electronic Engineers (IEEE) 1394 standard, the peripheral component interconnect express (PCI Express) standard, the universal serial bus (USB) standard, the SD interface standard, the ultra high speed-I (UHS-I) interface standard, the ultra high speed-II (UHS-II) interface standard, the memory stick (MS) interface standard, the multi chip package (MCP) interface standard, the multi media card (MMC) interface standard, the eMMC interface standard, the universal flash storage (UFS) interface standard, the eMCP interface standard, the CF interface standard, the integrated device electronics (IDE) standard, or other suitable standards. The connection interface unit 402 and the memory control circuit unit 404 may be packaged in one chip, or the connection interface unit 402 may be arranged outside a chip containing the memory control circuit unit 404.

The memory control circuit unit 404 is configured to execute multiple logic gates or control commands implemented in the form of hardware or the form of firmware and perform operations such as writing, reading, and erasing data in the rewritable non-volatile memory module 406 according to the commands of the host system 11.

The rewritable non-volatile memory module 406 is coupled to the memory control circuit unit 404 and is configured to store data written by the host system 11. The rewritable non-volatile memory module 406 may be a single level cell (SLC) NAND flash memory module (that is, a flash memory module that may store 1 bit in a memory cell), a multi level cell (MLC) NAND flash memory module (that is, a flash memory module that may store 2 bits in a memory cell), a triple level cell (TLC) NAND flash memory module (that is, a flash memory module that may store 3 bits in a memory cell), a quad level cell (QLC) NAND flash memory module (that is, a flash memory module that may store 4 bits in a memory cell), other flash memory modules, or other memory modules with the same characteristics.

Each memory cell in the rewritable non-volatile memory module 406 stores one or more bits with changes in voltage (hereinafter also referred to as a threshold voltage). Specifically, there is a charge trapping layer between the control gate and the channel of each memory cell. Through applying a write voltage to the control gate, the number of electrons in the charge trapping layer may be changed, thereby changing the threshold voltage of the memory cell. This operation of changing the threshold voltage of the memory cell is also referred to as "writing data to the memory cell" or "programming the memory cell". As the threshold voltage changes, each memory cell in the rewritable non-volatile memory module 406 has multiple storage statuses. Through applying a read voltage, it is possible to determine which storage status a memory cell belongs to, thereby obtaining one or more bits stored in the memory cell.

In an exemplary embodiment, the memory cells of the rewritable non-volatile memory module 406 may constitute multiple physical programming units, and the physical programming units may constitute multiple physical erasing units. Specifically, the memory cells on the same word line or the same word line plane may form one or more physical programming units. If each memory cell may store more than 2 bits, the physical programming units on the same word line or the same word line plane may be classified into at least a lower physical programming unit and an upper physical programming unit. The write speed of the lower physical programming unit may be greater than the write speed of the upper physical programming unit, and/or the reliability of the lower physical programming unit may be higher than the reliability of the upper physical programming unit.

In an exemplary embodiment, the physical programming unit is the smallest unit of programming. That is, the physical programming unit is the smallest unit of writing data. For example, the physical programming unit may be a physical page or a physical sector. If the physical programming unit is a physical page, the physical programming units may include a data bit area and a redundancy bit area. The data bit area contains multiple physical sectors for storing user data, and the redundancy bit area is configured to store system data (for example, management data such as an error correcting code). In this exemplary embodiment, the data bit area contains 32 physical sectors, and the size of one physical sector is 512 bytes (B). However, in other exemplary embodiments, the data bit area may also contain 8, 16, more, or less physical sectors, and the size of each physical sector may also be greater or smaller. On the other hand, the physical erasing unit is the smallest unit of erasure. That is, each physical erasing unit contains the smallest number of memory cells to be erased together. For example, the physical erasing unit is a physical block.

Figure 5:
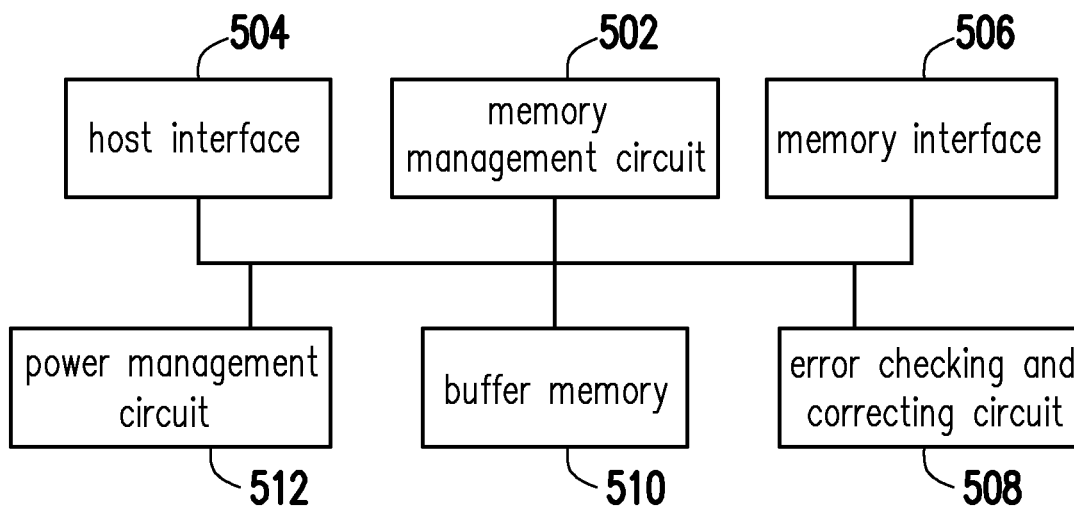
FIG. 5 is a schematic block diagram of a memory control circuit unit according to an exemplary embodiment of the disclosure.

FIG. 5 is a schematic block diagram of a memory control circuit unit according to an exemplary embodiment of the disclosure. Please refer to FIG. 5. A memory control circuit unit 404 includes a memory management circuit 502, a host interface 504, a memory interface 506, and an error detecting and correcting circuit 508.

The memory management circuit 502 is configured to control the overall operation of the memory control circuit unit 404. Specifically, the memory management circuit 502 has multiple control commands, and the control commands are executed to perform operations such as writing, reading, and erasing data when the memory storage device 10 is operating. The following description of the operation of the memory management circuit 502 is equivalent to the description of the operation of the memory control circuit unit 404.

In this exemplary embodiment, the control commands of the memory management circuit 502 are implemented in the form of firmware. For example, the memory management circuit 502 has a microprocessor unit (not shown) and a read only memory (not shown), and the control commands are burnt into the read only memory. When the memory storage device 10 is operating, the control commands are executed by the microprocessor unit to perform operations such as writing, reading, and erasing data.

In another exemplary embodiment, the control commands of the memory management circuit 502 may also be stored in a specific area (for example, a system area dedicated to storing system data in a memory module) of the rewritable non-volatile memory module 406 in the form of program codes. In addition, the memory management circuit 502 has a microprocessor unit (not shown), a read only memory (not shown), and a random access memory (not shown). In particular, the read only memory has a boot code, and the microprocessor unit first executes the boot code to load the control commands stored in the rewritable non-volatile memory module 406 to the random access memory of the memory management circuit 502 when the memory control circuit unit 404 is enabled. After that, the microprocessor unit runs the control commands to perform operations such as writing, reading, and erasing data.

In addition, in another exemplary embodiment, the control commands of the memory management circuit 502 may also be implemented in the form of hardware. For example, the memory management circuit 502 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage a memory cell or a memory cell group of the rewritable non-volatile memory module 406. The memory write circuit is configured to issue a write command sequence to the rewritable non-volatile memory module 406 to write data to the rewritable non-volatile memory module 406. The memory read circuit is configured to issue a read command sequence to the rewritable non-volatile memory module 406 to read data from the rewritable non-volatile memory module 406. The memory erase circuit is configured to issue an erase command sequence to the rewritable non-volatile memory module 406 to erase data from the rewritable non-volatile memory module 406. The data processing circuit is configured to process data to be written to the rewritable non-volatile memory module 406 and data read from the rewritable non-volatile memory module 406. The write command sequence, the read command sequence, and the erase command sequence may each include one or more program codes or command codes and are configured to instruct the rewritable non-volatile memory module 406 to execute corresponding operations such as writing, reading, and erasing. In an exemplary embodiment, the memory management circuit 502 may also issue other types of command sequences to the rewritable non-volatile memory module 406 to instruct to execute corresponding operations.

The host interface 504 is coupled to the memory management circuit 502. The memory management circuit 502 may communicate with the host system 11 through the host interface 504. The host interface 504 may be configured to receive and identify commands and data sent by the host system 11. For example, the commands and the data sent by the host system 11 may be sent to the memory management circuit 502 through the host interface 504. In addition, the memory management circuit 502 may send the data to the host system 11 through the host interface 504. In this exemplary embodiment, the host interface 504 is compatible with the SATA standard. However, it must be understood that the disclosure is not limited thereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 506 is coupled to the memory management circuit 502 and is configured to access the rewritable non-volatile memory module 406. That is to say, the data to be written to the rewritable non-volatile memory module 406 is converted into a format acceptable by the rewritable non-volatile memory module 406 via the memory interface 506. Specifically, if the memory management circuit 502 intends to access the rewritable non-volatile memory module 406, the memory interface 506 will send corresponding command sequences. For example, the command sequences may include a write command sequence instructing to write data, a read command sequence instructing to read data, an erase command sequence instructing to erase data, and corresponding command sequences instructing various memory operations (for example, changing a read voltage level, executing garbage collection operation, etc.). The command sequences are, for example, generated by the memory management circuit 502 and sent to the rewritable non-volatile memory module 406 through the memory interface 506. The command sequences may include one or more signals, or data on a bus. The signals or the data may include command codes or program codes. For example, the read command sequence includes information such as a read recognition code and a memory address.

The error detecting and correcting circuit 508 is coupled to the memory management circuit 502 and is configured to execute error detecting and correcting operations to ensure the correctness of the data. Specifically, when the memory management circuit 502 receives a write command from the host system 11, the error detecting and correcting circuit 508 generates a corresponding error correcting code (ECC) and/or error detecting code (EDC) for the data corresponding to the write command, and the memory management circuit 502 writes the data corresponding to the write command and the corresponding ECC and/or EDC to the rewritable non-volatile memory module 406. Later, when the memory management circuit 502 reads the data from the rewritable non-volatile memory module 406, the ECC and/or EDC corresponding to the data will also be simultaneously read, and the error detecting and correcting circuit 508 will execute the error checking and correcting operations on the read data according to the ECC and/or EDC.

In an exemplary embodiment, the memory control circuit unit 404 further includes a power management circuit 512 and a buffer memory 510. The power management circuit 512 is coupled to the memory management circuit 502 and is configured to control the power of the memory storage device 10. The buffer memory 510 is coupled to the memory management circuit 502 and is configured to temporarily store data and commands from the host system 11 or data from the rewritable non-volatile memory module 406.

In an exemplary embodiment, the rewritable non-volatile memory module 406 of FIG. 4 is also referred to as a flash memory module, the memory control circuit unit 404 is also referred to as a flash memory controller for controlling the flash memory module, and/or the memory management circuit 502 of FIG. 5 is also referred to as a flash memory management circuit.

Figure 6:
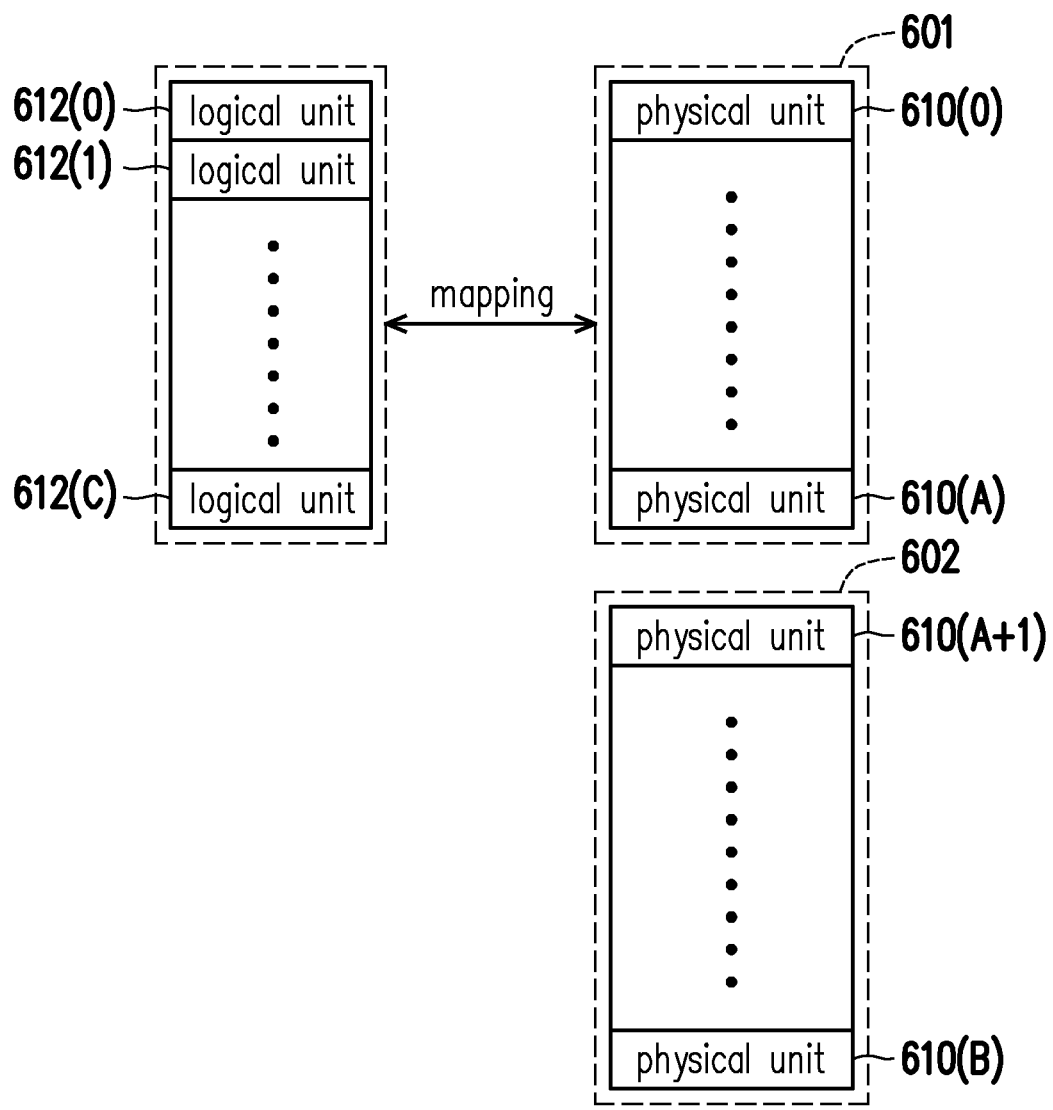
FIG. 6 is a schematic diagram of managing a rewritable non-volatile memory module according to an exemplary embodiment of the disclosure.

FIG. 6 is a schematic diagram of managing a rewritable non-volatile memory module according to an exemplary embodiment of the disclosure. Please refer to FIG. 6. The memory management circuit 502 logically groups physical units 610(0) to 610(B) of the rewritable non-volatile memory module 406 into a storage area 601 and a replacement area 602. The physical units 610(0) to 610(A) in the storage area 601 are configured to store data, and the physical units 610(A+1) to 610(B) in the replacement area 602 are configured to replace damaged physical units in the storage area 601. For example, if data read from a certain physical unit contains too many errors to be corrected, the physical unit is regarded as a damaged physical unit. It should be noted that if there is no available physical erasing unit in the replacement area 602, the memory management circuit 502 may declare the entire memory storage device 10 as a write protect status, and no more data can be written.

In this exemplary embodiment, each physical unit refers to a physical programming unit. However, in another exemplary embodiment, a physical unit may also refer to a physical address, a physical erasing unit, or consist of multiple continuous or discontinuous physical addresses. The memory management circuit 502 will configure logic units 612(0) to 612(C) to map the physical units 610(0) to 610(A) in the storage area 601. In this exemplary embodiment, each logic unit refers to a logic address. However, in another exemplary embodiment, a logic unit may also refer to a logic programming unit, a logic erasing unit, or consist of multiple continuous or discontinuous logic addresses. In addition, each of the logic units 612(0) to 612(C) may be mapped to one or more physical units.

The memory management circuit 502 may record a mapping relationship between the logic unit and the physical unit (also referred to as the logical-physical address mapping relationship) in at least one logical-physical address mapping table. When the host system 11 intends to read data from the memory storage device 10 or write data to the memory storage device 10, the memory management circuit 502 may execute a data access operation on the memory storage device 10 according to the logical-physical address mapping table.

Figure 7:
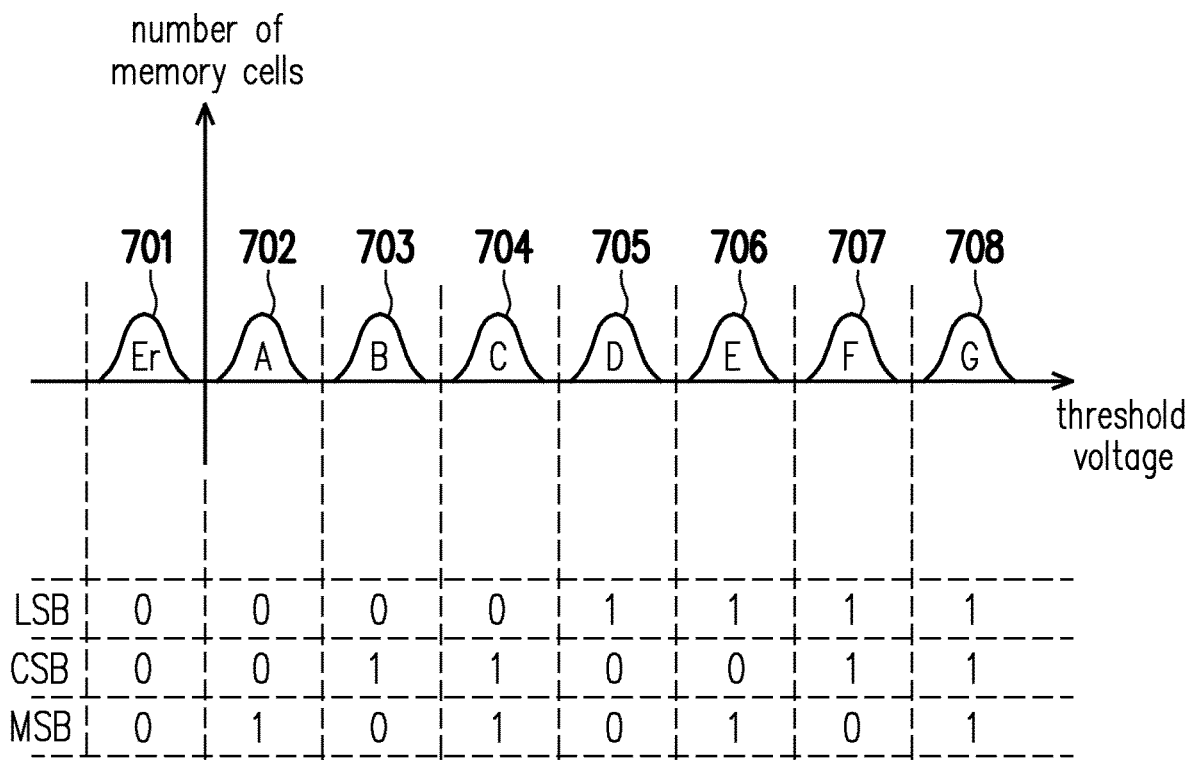
FIG. 7 is a schematic diagram of a threshold voltage distribution of a memory cell according to an exemplary embodiment of the disclosure.

FIG. 7 is a schematic diagram of a threshold voltage distribution of a memory cell according to an exemplary embodiment of the disclosure. Please refer to FIG. 7. Taking the TLC NAND flash memory module as an example, a memory cell in the rewritable non-volatile memory module 406 may store 3 bits. For example, the 3 bits that may be stored in a memory cell include a least significant bit (LSB), a center significant bit (CSB), and a most significant bit (MSB). Taking FIG. 7 as an example, assuming that the threshold voltage distribution of the programmed memory cell includes statuses 701 to 708 (or statuses Er to G), the threshold voltages respectively belonging to the statuses 701 to 708 (or the statuses Er to G) of the 3 bits (that is, the LSB, the CSB, and the MSB) stored by the memory cell are "000", "001", "010", "011", "100", "101", "110", and "111".

It should be noted that in different exemplary embodiments, the bit combination corresponding to each status may be different depending on practical requirements. For example, in an exemplary embodiment, the threshold voltages respectively belonging to the statuses 701 to 708 (or the statuses Er to G) of the 3 bits (that is, the LSB, the CSB, and the MSB) stored by the memory cell may be "111", "110"", "101", "100", "011", "010", "001", and "000". In addition, if a memory cell may store other numbers of bits (for example, 1, 2, or 4 bits), the total number of statuses contained in the threshold voltage distribution of the memory cell may also change depending on practical requirements.

In an exemplary embodiment, if a certain physical unit is configured to store the LSBs of multiple memory cells, this physical unit is also called a lower physical programming unit. In an exemplary embodiment, if a certain physical unit is a CSB configured to store multiple memory cells, this physical unit is also called a middle physical programming unit. In an exemplary embodiment, if a certain physical unit is configured to store the MSBs of multiple memory cells, the physical unit is also referred to as the upper physical programming unit.

In an exemplary embodiment, the error detecting and correcting circuit 508 may include an encoding circuit and a decoding circuit. The encoding circuit may be configured to encode data. For example, the encoding circuit may adopt at least one of encoding algorithms such as low density parity code (LDPC) or turbo code to encode data. The decoding circuit may be configured to decode data. For example, the decoding circuit may also adopt at least one of decoding algorithms such as LDPC or turbo code to decode data.

It should be noted that the encoding and decoding algorithms such as LDPC or turbo code all belong to probability solution algorithms and are not guaranteed solution algorithms. For example, common guaranteed solution algorithms may include exclusive-OR (XOR) and Reed Solomon code (RS code) algorithms.

The probability solution algorithm may use the concept of probability to determine whether the value of one of the error bits should be "0" or "1" in a greater number of error bits (for example, more than 10 error bits). For example, if the value of a certain error bit has a higher probability of being "1", the error detecting and correcting circuit 508 may correct the value of the error bit to "1". Conversely, if the value of a certain error bit has a higher probability of being "0", the error detecting and correcting circuit 508 may correct the value of the error bit to "0". However, the guaranteed solution algorithm may clearly determine (that is, guarantee) that the value of one of the error bits is "0" or "1" in a smaller number of error bits (for example, 1 to 2 error bits).

In an exemplary embodiment, the error detecting and correcting circuit 508 may execute an encoding operation (also referred to as a single page encoding operation) on data (also referred to as first data) stored in the first type physical unit to generate parity data (also referred to as local parity data). For example, the error detecting and correcting circuit 508 may use the probability resolution algorithm (for example, the LDPC algorithm) to execute the single page encoding operation. The generated local parity data may be configured to protect the first data and may be stored in a certain physical unit in the rewritable non-volatile memory module 406. For example, the local parity data and the corresponding first data may be stored in the same physical unit or another physical unit, which is not limited by the disclosure.

In an exemplary embodiment, the error detecting and correcting circuit 508 may execute another encoding operation (also referred to as a global encoding operation) on data (also referred to as second data) stored in at least two of the first type physical unit, the second type physical unit, and the third type physical unit to generate parity data (also referred to as global parity data). The second data includes the first data. For example, the error detecting and correcting circuit 508 may use the probability resolution algorithm (for example, the LDPC algorithm) to execute the global encoding operation. The generated global parity data may be configured to protect the second data and may be stored in a certain physical unit in the rewritable non-volatile memory module 406.

In an exemplary embodiment, the first type physical unit may belong to one of the lower physical programming unit, the middle physical programming unit, and the upper physical programming unit. The second type physical unit may belong to another one of the lower physical programming unit, the middle physical programming unit, and the upper physical programming unit. The third type physical unit may belong to yet another one of the lower physical programming unit, the middle physical programming unit, and the upper physical programming unit. For example, assuming that the first type physical unit is the lower physical programming unit, the second type physical unit and the third type physical unit may respectively be the middle physical programming unit and the upper physical programming unit. Alternatively, assuming that the first type physical unit is the middle physical programming unit, the second type physical unit and the third type physical unit may respectively be the lower physical programming unit and the upper physical programming unit. Alternatively, assuming that the first type physical unit is the upper physical programming unit, the second type physical unit and the third type physical unit may respectively be the middle physical programming unit and the lower physical programming unit.

In an exemplary embodiment, when the first data is read from the first type physical unit, the error detecting and correcting circuit 508 may execute a single decoding operation (also referred to as a single page decoding operation) on the first data according to the local parity data. The single page decoding operation may try to correct possible errors in the first data. If the single page decoding operation is successful (that is, the error detecting and correcting circuit 508 successfully corrects all errors in the first data), the memory management circuit 502 may output the successfully decoded data. For example, the memory management circuit 502 may send the successfully decoded first data to the host system 11 to respond to a read request of the host system 11. However, if the error detecting and correcting circuit 508 cannot successfully correct all errors in the first data, the memory management circuit 502 may determine that the single page decoding operation has failed.

In an exemplary embodiment, the memory management circuit 502 may read the second data from at least two of the first type physical unit, the second type physical unit, and the third type physical unit in response to the failure of the single page decoding operation. The error detecting and correcting circuit 508 may execute a decoding operation (also referred to as a global decoding operation) on the second data according to the global parity data to try to correct errors in the first data again.

Figure 8:
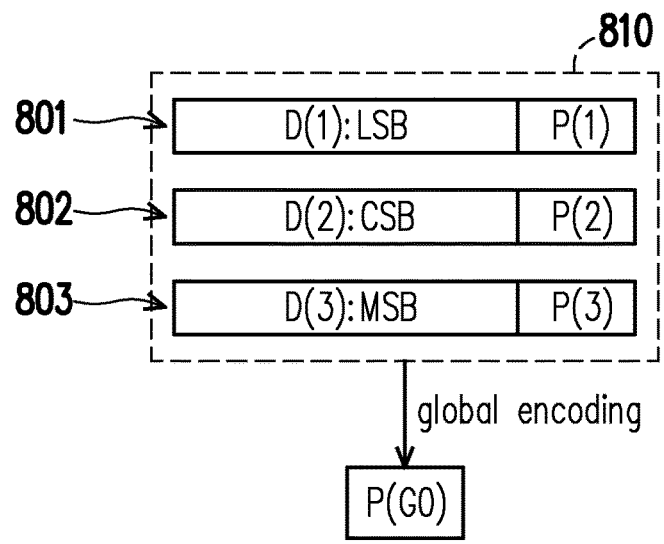
FIG. 8 is a schematic diagram of an encoding operation according to an exemplary embodiment of the disclosure.

FIG. 8 is a schematic diagram of an encoding operation according to an exemplary embodiment of the disclosure. Please refer to FIG. 8. It is assumed that physical units 801 to 803 are respectively configured to store data D(1) to D(3). The data D(1) to D(3) respectively belong to the LSBs, the CSBs, and the MSBs of multiple memory cells (also referred to as first memory cells). When storing the data D(1) to D(3), the error detecting and correcting circuit 508 may respectively execute the single page encoding operations on the data D(1) to D(3) to generate parity data P(1) to P(3). The parity data P(1) to P(3) are all local parity data and are respectively configured to protect the data D(1) to D(3). In addition, the parity data P(1) to P(3) may be respectively stored in the physical units 801 to 803. For example, the parity data P(1) to P(3) may be respectively stored in the redundancy bit areas in the physical units 801 to 803.

After generating the parity data P(1) to P(3), the error detecting and correcting circuit 508 may further execute the global encoding operation on data 810 to generate parity data P(G0). The data 810 may contain the data D(1) to D(3) and the parity data P(1) to P(3). The parity data P(G0) is the global parity data and may be configured to simultaneously protect the data 810. The parity data P(G0) may be stored in a certain physical unit.

Later, when reading certain data (for example, the data D(1)) in the data D(1) to D(3), the parity data P(1) may be simultaneously read. The error detecting and correcting circuit 508 may execute the single page decoding operation on the data D(1) according to the parity data P(1) to try to correct errors in the data D(1). If the data D(1) is successfully decoded, the successfully decoded data D(1) may be output. However, if the decoding of the data D(1) fails, the data D(2) and D(3) and the parity data P(2) and P(3) may be successively read to obtain the data 810 containing the data D(1). The error detecting and correcting circuit 508 may decode the data 810 according to the parity data P(G0) to try to use more information to correct the errors in the data D(1). Similarly, when the single page decoding operation of the data D(2) and/or D(3) fails, the parity data P(G0) may also be configured to correct errors in the data D(2) and/or D(3).

It should be noted that, in the exemplary embodiment of FIG. 8, the data 810 (for example, the data D(1) to D(3)) involved in global encoding are all stored in the same memory cell (that is, the first memory cell). For example, the physical units 801, 802, and 803 are all located on the same word line or word line plane. However, in another exemplary embodiment, data involved in global encoding may also be stored in different memory cells.

Figures 9A, 9B:
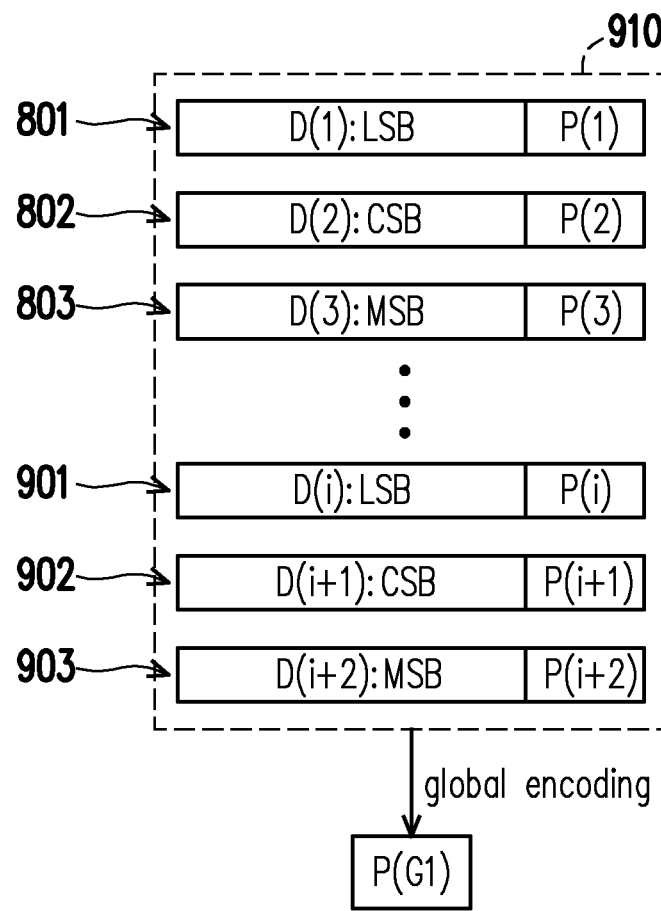
FIG. 9A is a schematic diagram of an encoding operation according to an exemplary embodiment of the disclosure.
FIG. 9B is a schematic diagram of a parity check matrix according to an exemplary embodiment of the disclosure.

FIG. 9A is a schematic diagram of an encoding operation according to an exemplary embodiment of the disclosure. Please refer to FIG. 9A. It is assumed that the physical units 801 to 803 are respectively configured to store the data D(1) to D(3). The data D(1) to D(3) respectively belong to the LSBs, the CSBs, and the MSBs of multiple memory cells (that is, the first memory cells). When storing the data D(1) to D(3), the error detecting and correcting circuit 508 may respectively execute the single page encoding operations on the data D(1) to D(3) to generate the parity data P(1) to P(3). In addition, physical units 901 to 903 are respectively configured to store data D(i) to D(i+2). The data D(i) to D(i+2) respectively belong to the LSBs, the CSBs, and the MSBs of multiple memory cells (also referred to as second memory cells). It should be noted that the second memory cell does not belong to the first memory cell. For example, the physical units 801 to 803 may be located on a certain word line or word line plane while the physical units 901 to 903 may be located on another word line or word line plane. When storing the data D(i) to D(i+2), the error detecting and correcting circuit 508 may respectively execute the single page encoding operations on the data D(i) to D(i+2) to generate parity data P(i) to P(i+2).

After generating the parity data P(1) to P(3) and P(i) to P(i+2), the error detecting and correcting circuit 508 may further execute the global encoding operation on data 910 to generate parity data P(G1). The data 910 may contain the data D(1) to D(3) and D(i) to D(i+2) and the parity data P(1) to P(3) and P(i) to P(i+2). The parity data P(G1) may be stored in a certain physical unit.

Later, when reading certain data (for example, the data D(1)) in the data D(1) to D(3) and D(i) to D(i+2), the parity data P(1) may be simultaneously read. The error detecting and correcting circuit 508 may execute the single page decoding operation on the data D(1) according to the parity data P(1) to try to correct the errors in the data D(1). If the data D(1) is successfully decoded, the successfully decoded data D(1) may be output. However, if the decoding of the data D(1) fails, the data D(2), D(3), and D(i) to D(i+2) and the parity data P(2), P(3), and P(i) to to P(i+2) may be successively read to obtain the data 910 containing the data D(1). The error detecting and correcting circuit 508 may decode the data 910 according to the parity data P(G1) to try to use more information to correct the errors in the data D(1). Similarly, when the single page decoding operation for any one of the data D(2), D(3), and D(i) to D(i+2) fails, the parity data P(G1) may also be configured to correct errors in the data D(2), D(3), and D(i) to D(i+2).

It should be noted that in an exemplary embodiment, the parity data P(1) may be involved in the single page decoding operation for the data D(1) and the global decoding operation for the data 810 (or 910). For example, when executing the single page decoding operation for the data D(1), the parity data P(1) may be read from the physical unit 801 and applied to the single page decoding operation for the data D(1). After executing the single page decoding operation for the data D(1), the parity data P(1) may be read from the physical unit 801 again in response to the failure of the single page decoding operation for the data D(1), and applied to the global decoding operation for the data 810 (or 910).

It should be noted that in an exemplary embodiment, the data 810 (or 910) configured to generate the global parity data P(G0) (or P(G1)) may not contain the local parity data P(1) to P(3) (or P(1) to P(3) and P(i) to P(i+2)). Alternatively, in an exemplary embodiment, the global parity data may also be generated according to only data stored in specific types of physical units (for example, the upper physical programming unit and the middle physical programming unit) while data stored in certain types of physical units (for example, the lower physical programming unit) is skipped.

In an exemplary embodiment, in the global encoding operation, the error detecting and correcting circuit 508 may perform global encoding targeting only the data in the upper physical programming unit and the middle physical programming unit (for example, the data D(2) and D(3) in FIG. 8 or the data D(2), D(3), D(i+1), and D(i+2) in FIG. 9A) (that is, global encoding is not performed on the data in the lower physical programming unit) to generate the global parity data (for example, the data P(G0) or P(G1)). The probability of the data stored in the upper physical programming unit and the middle physical programming unit containing error bits is higher than the probability of the data stored in the lower physical programming unit containing error bits. Therefore, in an exemplary embodiment, global encoding is performed only on the data in the upper physical programming unit and the middle physical programming unit, which can effectively improve the protection capability (or error correction capability) of the data in the upper physical programming unit and the middle physical programming unit without significantly increasing the encoding/decoding burden.

In an exemplary embodiment, in the global encoding operation, the error detecting and correcting circuit 508 may perform global encoding targeting the data in the upper physical programming unit, the middle physical programming unit, and the lower physical programming unit (for example, the data D(1) to D(3) in FIG. 8 or the data D(1) to D(3) and D(i) to D(i+2) in FIG. 9A) to generate the global parity data (for example, the data P(G0) or P(G1)). In this way, although the encoding/decoding burden of the system may increase, the protection capability (or error correction capability) of all data in the memory cell can be significantly improved.

In an exemplary embodiment, the error detecting and correcting circuit 508 may use the same parity check matrix H to execute the single page and global encoding/decoding operations. For example, when executing the single page encoding/decoding operation, the error detecting and correcting circuit 508 may use sub-matrixes H1(1) to H1(n) of a part of the parity check matrix H to encode the single page data to generate the local parity data or decode the read single page data. Thereafter, when executing the global encoding/decoding operation, the error detecting and correcting circuit 508 may use a sub-matrix H2 of another part of the parity check matrix H to encode global data to generate the global parity data or decode the read global data. It should be noted that the global data refers to data containing multiple single page data, such as the data 810 in FIG. 8 or the data 910 in FIG. 9.

FIG. 9B is a schematic diagram of a parity check matrix according to an exemplary embodiment of the disclosure. Please refer to FIG. 9B. The parity check matrix H may contain the sub-matrixes H1(1) to H1(n) and H2. In the single page encoding operation, the sub-matrixes H1(1) to H1(n) in the parity check matrix H may be respectively involved in the encoding of n single page data to generate n local parity data. In the global encoding operation, the sub-matrix H2 in the parity check matrix H may be involved in common encoding (that is, global encoding) of the n single page data to generate the global parity data. Taking FIG. 9A as an example, in the single page encoding operation, multiple data bits in the single page data D(i) in the n single page data may be multiplied by the sub-matrix H1(i) in the sub-matrixes H1(1) to H1(n) to generate the parity data P(i) corresponding to the single page data D(i). In the global encoding operation, the data 910 containing the n single page data may be multiplied by the sub-matrix H2 to generate the parity data P(G1).

In the single page decoding operation, the sub-matrixes H1(1) to H1(n) in the parity check matrix H may be respectively involved in the decoding of the n single page data. In the global decoding operation, the sub-matrix H2 in the parity check matrix H may be involved in common decoding (that is, global decoding) of the n single page data. Taking FIG. 9A as an example, in the single page decoding operation, the sub-matrix H1(i) in the sub-matrixes H1(1) to H1(n) may be multiplied by the multiple data bits in the single page data D(i) in the n single page data. The computation result may be applied in the single page decoding operation. In the global decoding operation, the sub-matrix H2 may be multiplied by the data 910 containing the n single page data. The computation result may be applied in the global decoding operation.

In an exemplary embodiment, the encoding/decoding circuit in the error detecting and correcting circuit 508 may be configured according to the parity check matrix H. Therefore, the error detecting and correcting circuit 508 may execute one of the single page encoding operation, the global encoding operation, the single page decoding operation, and the global decoding operation on data at different time points according to the same parity check matrix H and/or the same encoding/decoding circuit, thereby reducing the circuit configuration space and/or circuit complexity of the error detecting and correcting circuit 508.

Figure 10:
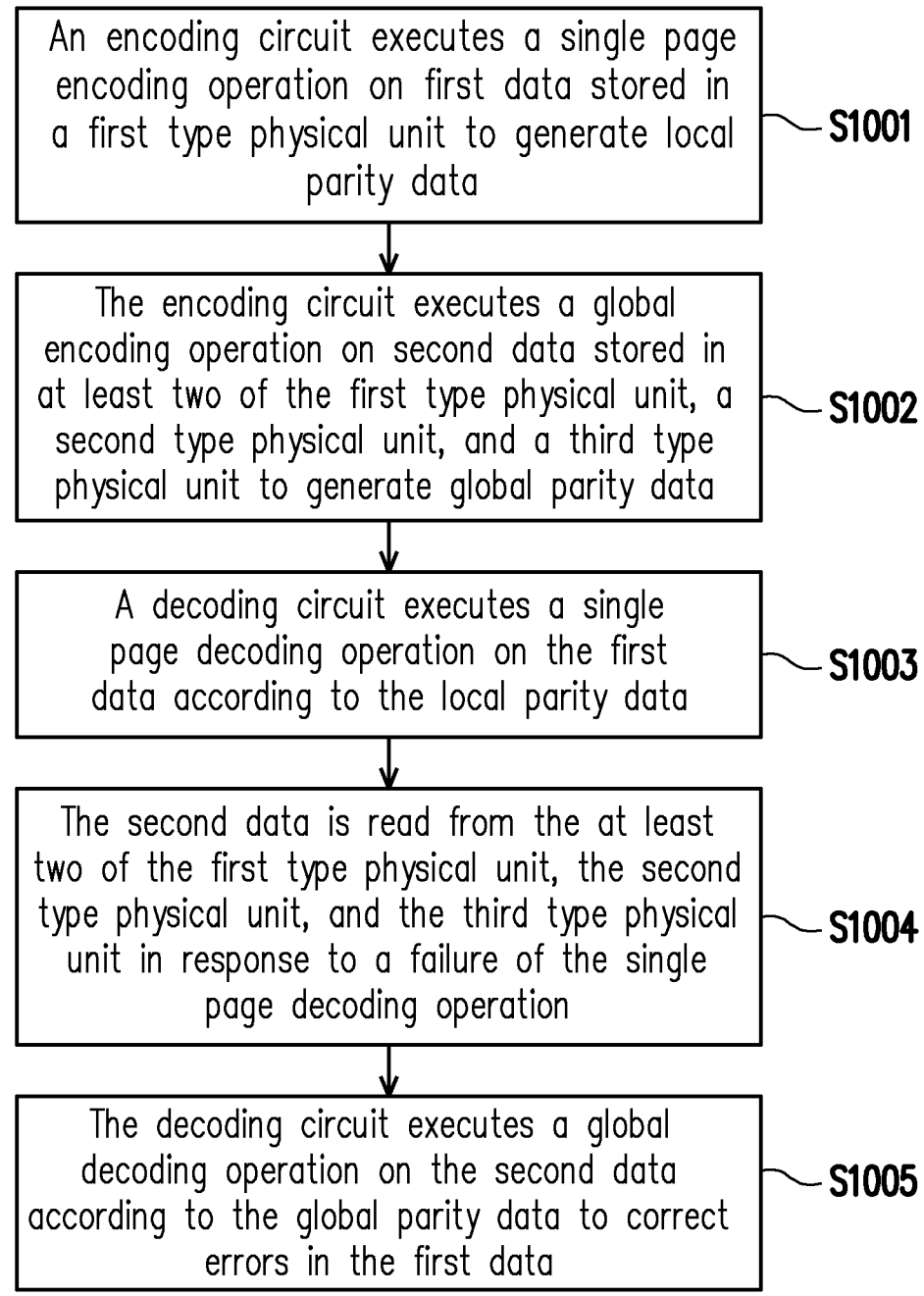
FIG. 10 is a flowchart of a memory control method according to an exemplary embodiment of the disclosure.

FIG. 10 is a flowchart of a memory control method according to an exemplary embodiment of the disclosure. Please refer to FIG. 10. In Step S1001, an encoding circuit executes a single page encoding operation on first data stored in a first type physical unit to generate local parity data. In Step S1002, the encoding circuit executes a global encoding operation on second data stored in at least two of the first type physical unit, a second type physical unit, and a third type physical unit to generate global parity data. The second data includes the first data. In Step S1003, a decoding circuit executes a single page decoding operation on the first data according to the local parity data. In Step S1004, the second data is read from the at least two of the first type physical unit, the second type physical unit, and the third type physical unit in response to a failure of the single page decoding operation. In Step S1005, the decoding circuit executes a global decoding operation on the second data according to the global parity data to correct errors in the first data.

Figure 11:
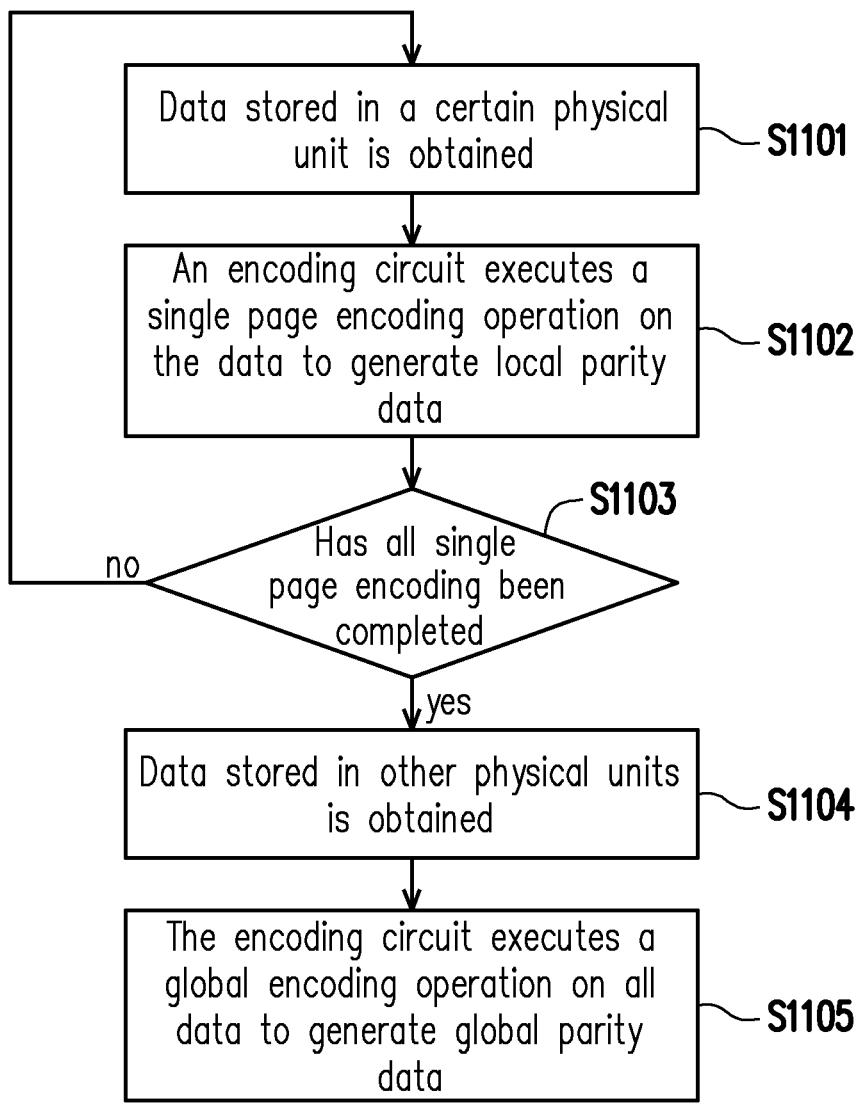
FIG. 11 is a flowchart of a memory control method according to an exemplary embodiment of the disclosure.

FIG. 11 is a flowchart of a memory control method according to an exemplary embodiment of the disclosure. Please refer to FIG. 11. In Step S1101, data stored in a certain physical unit in multiple preset physical units is obtained. For example, the data may come from a host system and will be stored in the physical unit. In Step S1102, an encoding circuit executes a single page encoding operation on the data to generate local parity data. In Step S1103, whether single page encoding of all data in the multiple physical units has been completed is determined. If not, Steps S1101 and S1102 may be repeatedly executed. If yes, single page encoding of all data in the preset multiple physical units has been completed. Therefore, in Step S1104, data stored by other physical units that intend to be involved in global encoding may be obtained (that is, all data in the multiple preset physical units may be obtained). In Step S1105, the encoding circuit executes a global encoding operation on all data to generate global parity data.

Figure 12:
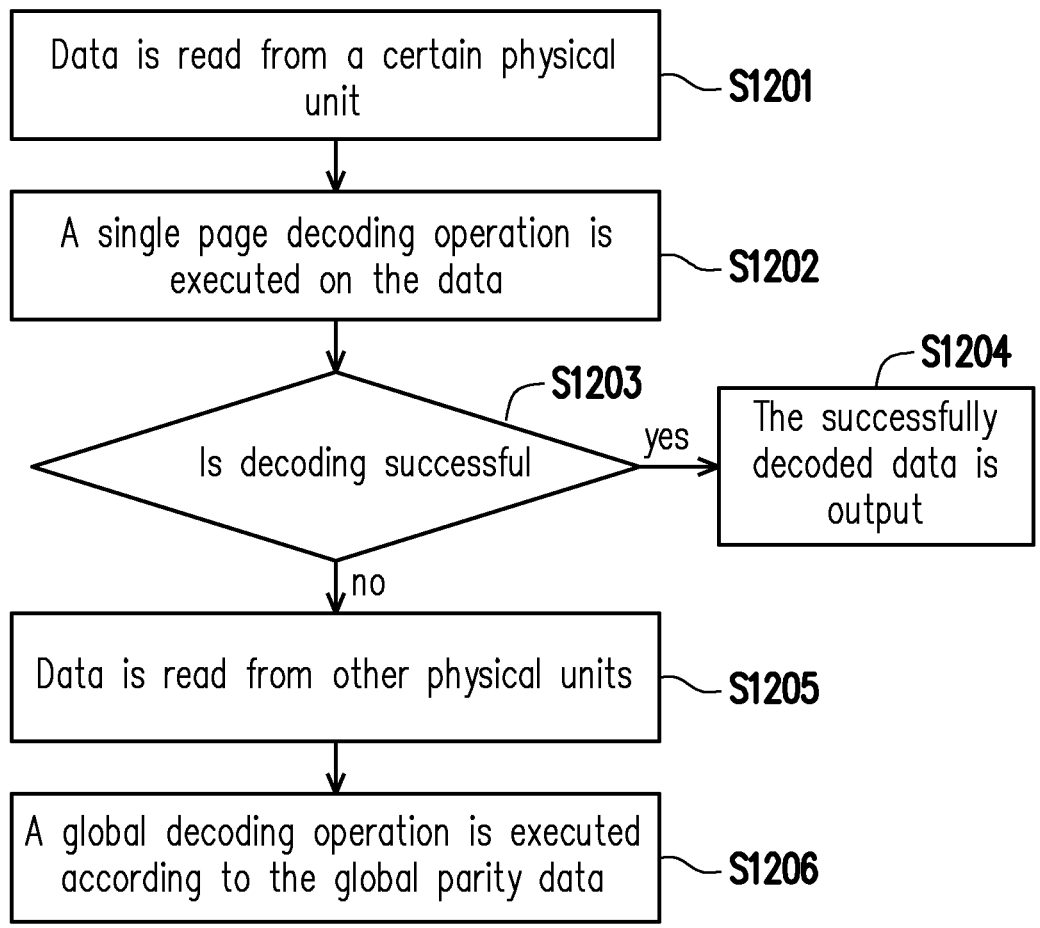
FIG. 12 is a flowchart of a memory control method according to an exemplary embodiment of the disclosure.

FIG. 12 is a flowchart of a memory control method according to an exemplary embodiment of the disclosure. Please refer to FIG. 12. In Step S1201, data is read from a certain physical unit. In Step S1202, a single page decoding operation is executed on the data. In Step S1203, whether decoding is successful is determined. If yes, in Step S1204, the successfully decoded data may be output. If not, the single page decoding operation on the data has failed. Therefore, in Step S1205, data may be read from other physical units. For example, the data have been previously encoded together to generate shared global parity data. In Step S1206, a global decoding operation may be executed according to the global parity data to try to correct errors in the data.

In an embodiment, the single page decoding operation for the same data in Step S1202 may be repeatedly executed several times to continuously try to correct the errors in the data. In an embodiment, when the number of executions of the single page decoding operation for the same data exceeds a preset number of times, Steps S1205 and S1206 are entered to further use the global decoding operation to correct the errors in the data.

However, each step in FIG. 10 to FIG. 12 has been described in detail as above, and will not be repeated here. It should be noted that each step in FIG. 10 to FIG. 12 may be implemented as multiple program codes or circuits, which is not limited by the disclosure. In addition, the methods of FIG. 10 to FIG. 12 may be used in conjunction with the above exemplary embodiments or may be used alone, which is not limited by the disclosure.

In summary, when decoding data, single page decoding may be first executed on the data. If the data cannot be successfully decoded, global decoding may be further executed on the data to use more information to try to correct errors in the data. In this way, the decoding success rate of data with a higher error rate can be effectively improved. In addition, through using the same parity check matrix to execute the single page encoding/decoding and global encoding/decoding operations, the circuit configuration space and/or circuit complexity of the encoding/decoding circuit can be effectively reduced.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be determined by the scope of the appended claims.

What is claimed is:

1. A memory control method for a rewritable non-volatile memory module, wherein the rewritable non-volatile memory module comprises a plurality of physical units, and the plurality of physical units comprise a first type physical unit, a second type physical unit, and a third type physical unit, the memory control method comprising:
    executing, by an encoding circuit, a single page encoding operation on first data stored in the first type physical unit to generate local parity data;
    executing, by the encoding circuit, a global encoding operation on second data stored in at least two of the first type physical unit, the second type physical unit, and the third type physical unit to generate global parity data, wherein the second data comprises the first data;
    executing, by a decoding circuit, a single page decoding operation on the first data according to the local parity data;
    reading the second data from the at least two of the first type physical unit, the second type physical unit, and the third type physical unit in response to a failure of the single page decoding operation; and
    executing, by the decoding circuit, a global decoding operation on the second data according to the global parity data to correct an error in the first data.

2. The memory control method according to claim 1, wherein the decoding circuit uses a probability resolution algorithm to execute the single page decoding operation and the global decoding operation.

3. The memory control method according to claim 1, wherein the first type physical unit belongs to one of a lower physical programming unit, a middle physical programming unit, and an upper physical programming unit,
    the second type physical unit belongs to another one of the lower physical programming unit, the middle physical programming unit, and the upper physical programming unit, and
    the third type physical unit belongs to yet another one of the lower physical programming unit, the middle physical programming unit, and the upper physical programming unit.

4. The memory control method according to claim 3, wherein the lower physical programming unit is configured to store a least significant bit of a plurality of first memory cells, the middle physical programming unit is configured to store a center significant bit of the plurality of first memory cells, and the upper physical programming unit is configured to store a most significant bit of the plurality of first memory cells.

5. The memory control method according to claim 3, wherein the at least two of the first type physical unit, the second type physical unit, and the third type physical unit contain the upper physical programming unit and the middle physical programming unit, and do not contain the lower physical programming unit.

6. The memory control method according to claim 3, wherein the at least two of the first type physical unit, the second type physical unit, and the third type physical unit contain the upper physical programming unit, the middle physical programming unit, and the lower physical programming unit.

7. The memory control method according to claim 1, further comprising:
storing the local parity data in the first type physical unit after generating the local parity data; and
reading the local parity data from the first type physical unit in response to the failure of the single page decoding operation, and applying the local parity data in the global decoding operation.

8. A memory storage device, comprising:
a connection interface unit, configured to be coupled to a host system;
a rewritable non-volatile memory module, wherein the rewritable non-volatile memory module comprises a plurality of physical units, and the plurality of physical units comprise a first type physical unit, a second type physical unit, and a third type physical unit; and
a memory control circuit unit, coupled to the connection interface unit and the rewritable non-volatile memory module, wherein
the memory control circuit unit is configured to execute a single page encoding operation on first data stored in the first type physical unit to generate local parity data,
the memory control circuit unit is further configured to execute a global encoding operation on second data stored in at least two of the first type physical unit, the second type physical unit, and the third type physical unit to generate global parity data, wherein the second data comprises the first data,
the memory control circuit unit is further configured to execute a single page decoding operation on the first data according to the local parity data,
the memory control circuit unit is further configured to read the second data from the at least two of the first type physical unit, the second type physical unit, and the third type physical unit in response to a failure of the single page decoding operation, and
the memory control circuit unit is further configured to execute a global decoding operation on the second data according to the global parity data to correct an error in the first data.

9. The memory storage device according to claim 8, wherein the memory control circuit unit uses a probability resolution algorithm to execute the single page decoding operation and the global decoding operation.

10. The memory storage device according to claim 8, wherein the first type physical unit belongs to one of a lower physical programming unit, a middle physical programming unit, and an upper physical programming unit,
the second type physical unit belongs to another one of the lower physical programming unit, the middle physical programming unit, and the upper physical programming unit, and
the third type physical unit belongs to yet another one of the lower physical programming unit, the middle physical programming unit, and the upper physical programming unit.

11. The memory storage device according to claim 10, wherein the lower physical programming unit is configured to store a least significant bit of a plurality of first memory cells, the middle physical programming unit is configured to store a center significant bit of the plurality of first memory cells, and the upper physical programming unit is configured to store a most significant bit of the plurality of first memory cells.

12. The memory storage device according to claim 10, wherein the at least two of the first type physical unit, the second type physical unit, and the third type physical unit contain the upper physical programming unit and the middle physical programming unit, and do not contain the lower physical programming unit.

13. The memory storage device according to claim 10, wherein the at least two of the first type physical unit, the second type physical unit, and the third type physical unit contain the upper physical programming unit, the middle physical programming unit, and the lower physical programming unit.

14. The memory storage device according to claim 8, wherein the memory control circuit unit is further configured to store the local parity data in the first type physical unit after generating the local parity data, and
the memory control circuit unit is further configured to read the local parity data from the first type physical unit in response to the failure of the single page decoding operation, and apply the local parity data in the global decoding operation.

15. A memory control circuit unit for controlling a rewritable non-volatile memory module, wherein the rewritable non-volatile memory module comprises a plurality of physical units, and the plurality of physical units comprise a first type physical unit, a second type physical unit, and a third type physical unit, the memory control circuit unit comprising:
a host interface, configured to be coupled to a host system;
a memory interface, configured to be coupled to the rewritable non-volatile memory module;
an error detecting and correcting circuit; and
a memory management circuit, coupled to the host interface, the memory interface, and the error detecting and correcting circuit, wherein
the error detecting and correcting circuit is configured to execute a single page encoding operation on first data stored in the first type physical unit to generate local parity data,
the error detecting and correcting circuit is further configured to execute a global encoding operation on second data stored in at least two of the first type physical unit, the second type physical unit, and the third type physical unit to generate global parity data, wherein the second data comprises the first data,
the error detecting and correcting circuit is further configured to execute a single page decoding operation on the first data according to the local parity data,
the memory management circuit is configured to read the second data from the at least two of the first type physical unit, the second type physical unit, and the third type physical unit in response to a failure of the single page decoding operation, and
the error detecting and correcting circuit is further configured to execute a global decoding operation on the second data according to the global parity data to correct an error in the first data.

16. The memory control circuit unit according to claim 15, wherein the error detecting and correcting circuit uses a probability resolution algorithm to execute the single page decoding operation and the global decoding operation.

17. The memory control circuit unit according to claim 15, wherein the first type physical unit belongs to one of a lower physical programming unit, a middle physical programming unit, and an upper physical programming unit, the second type physical unit belongs to another one of the lower physical programming unit, the middle physical programming unit, and the upper physical programming unit, and the third type physical unit belongs to yet another one of the lower physical programming unit, the middle physical programming unit, and the upper physical programming unit.

18. The memory control circuit unit according to claim 17, wherein the lower physical programming unit is configured to store a least significant bit of a plurality of first memory cells, the middle physical programming unit is configured to store a center significant bit of the plurality of first memory cells, and the upper physical programming unit is configured to store a most significant bit of the plurality of first memory cells.

19. The memory control circuit unit according to claim 17, wherein the at least two of the first type physical unit, the second type physical unit, and the third type physical unit contain the upper physical programming unit and the middle physical programming unit, and do not contain the lower physical programming unit.

20. The memory control circuit unit according to claim 17, wherein the at least two of the first type physical unit, the second type physical unit, and the third type physical unit contain the upper physical programming unit, the middle physical programming unit, and the lower physical programming unit.

21. The memory control circuit unit according to claim 15, wherein the memory management circuit is further configured to store the local parity data in the first type physical unit after generating the local parity data, and the memory management circuit is further configured to read the local parity data from the first type physical unit in response to the failure of the single page decoding operation, and apply the local parity data in the global decoding operation.

* * * * *